US010373799B2

(12) United States Patent
Neuman

(10) Patent No.: US 10,373,799 B2
(45) Date of Patent: Aug. 6, 2019

(54) PROBE LANDING DETECTION

(71) Applicant: FEI Company, Hillsboro, OR (US)

(72) Inventor: Yoav Neuman, Plano, TX (US)

(73) Assignee: FEI Company, Hillsboro, OR (US)

( * ) Notice: Subject to any disclaimer, the term of this patent is extended or adjusted under 35 U.S.C. 154(b) by 430 days.

(21) Appl. No.: 15/253,680

(22) Filed: Aug. 31, 2016

(65) Prior Publication Data

US 2018/0061612 A1 Mar. 1, 2018

(51) Int. Cl.
*H01J 37/26* (2006.01)
*G01V 1/00* (2006.01)
*G01H 9/00* (2006.01)

(52) U.S. Cl.
CPC ............. *H01J 37/261* (2013.01); *G01H 9/00* (2013.01); *G01V 1/001* (2013.01); *H01J 2237/0203* (2013.01); *H01J 2237/20292* (2013.01)

(58) Field of Classification Search
USPC ................................. 850/33, 9, 54, 55, 1, 6
See application file for complete search history.

(56) References Cited

U.S. PATENT DOCUMENTS 5,436,448 A * 7/1995 Hosaka .................. B82Y 10/00 250/307
5,705,814 A * 1/1998 Young .................... G01Q 30/06 250/307
6,953,930 B2 * 10/2005 Murashita .............. B82Y 20/00 250/306
2004/0196037 A1 * 10/2004 Xiang .................... G01N 24/00 324/300
2008/0049236 A1 * 2/2008 Iyoki ...................... B82Y 35/00 356/614
2014/0367571 A1 12/2014 Schampers et al.

FOREIGN PATENT DOCUMENTS

JP 2007189113 7/2007

OTHER PUBLICATIONS

Yang, Chih-Wen, et al., "Torsional resonance mode atomic force microscopy in liquid with Lorentz force actuation," Nanotechnology, Jun. 27, 2013, 7 pages, vol. 24, No. 30.

* cited by examiner

*Primary Examiner* — Kiet T Nguyen

(57) ABSTRACT

Probe landing is detected by detecting a change in a vibration of the probe in a plane substantially parallel to the work piece surface as the probe is lowered toward the work piece. The vibration may be observed, for example, by acquiring multiple electron microscope images of the probe as it moves and analyzing the images the determine a characteristic, such as the amplitude of the vibration. When the probe contacts the work piece surface, the friction between the probe tip and the work piece surface will change the characteristic of the vibration, which can be detected to indicate that the probe has landed.

19 Claims, 6 Drawing Sheets

PROBE LANDING DETECTION

TECHNICAL FIELD OF THE INVENTION

The present invention relates to detection of a probe landing on a work piece surface.

BACKGROUND OF THE INVENTION

Circuit testing may involve contacting a circuit with a probe. Nano-probe fault isolation systems for circuit testing use motorized nano-probes that can electrically contact a circuit and inject or detect signals. Such techniques are often used in the semiconductor industry. Nano-probing allows investigation of the electrical parameters of a nano-scale device. Probe systems may include a microscope, such as an optical microscope or scanning electron microscope (SEM), that provides an enlarged image of the probe and the work piece to facilitate the placement of the probe onto the desired region of the work piece. If an SEM is used, the probing is performed in the vacuum chamber of the SEM.

A critical step in the nano-probing process is probe landing, that is, the process of lowering the probe toward its respective target areas on the work piece until contact is achieved. Due to the minute dimensions of the nano-probe, this process is highly sensitive. Probe tips typically have a width of only a few tens of nanometers, and are easily damaged. As a result, probe touchdown event must be detected with extreme accuracy, preferably with an error of less than 50 nm. Continued forcing of the probe downward after touchdown can damage the probe, the work piece, or both.

Probe touchdown is currently detected manually by a human operator having significant operator expertise. The probe is navigated to the desired target area, while remaining above the work piece. The probe is then driven downwards while being monitored by the operator, who stops the downward motion when he detects contact between the probe and the work piece. The indication of probe touchdown is subtle, often seen as a shadow effect or slight darkening of the area around the probe tip in SEM images of the target area and surroundings.

Due to the subtleness and difficulty with detecting probe touchdown, the process is prone to damage both the probe and the work piece under investigation. In addition, the probes are expensive and manual probe touchdown provides limited probe longevity, requiring costly replacement.

A system for repeatedly and reliably lowering a probe to contact a surface is therefore desired, particularly an automated system that can be readily automated.

SUMMARY OF THE INVENTION

An object of the invention is to provide a method and apparatus for determining when a probe contacts a work piece surface.

A probe is vibrated in a plane having a component parallel to a work piece surface and the vibration is monitored while the probe tip is lowered toward the work piece surface. Contact of the probe with the surface is detected as a change in a characteristic of the vibration. Contact can be detected, automatically or manually, before excessive force damages the probe or work piece.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the invention provide a method for automated probe touchdown detection. In this disclosure, the terms “touchdown”, “landing”, and “contact” all refer to the probe contacting the surface after moving towards it.

Figure 1A:
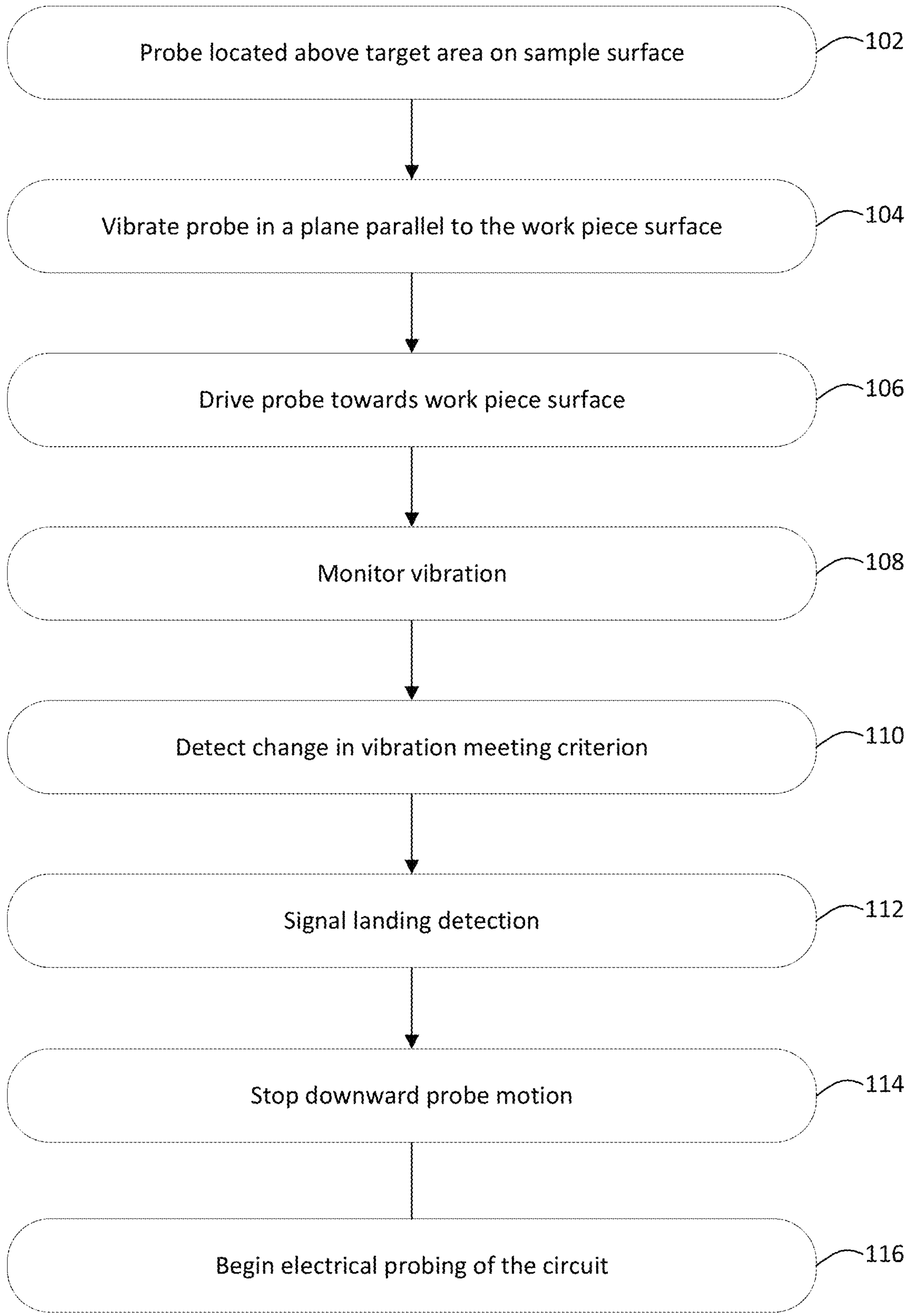
FIG. 1A is a flowchart of a method of landing detection.

FIG. 1A shows a flow chart for a method for landing a probe on a target while minimizing damage to the work piece and the probe. The target may be, for example, a contact pad on an integrated circuit. Beginning in step 102, the probe is positioned above the target area on the work piece surface. The probe may be moved into position above the target area automatically or manually by an operator. Next, in step 104, the probe is vibrated in a plane that is preferably substantially parallel to the work piece surface.

The vibration is generated by a probe-positioning actuator, which is driven to produce a repeating motion of the probe base, to either displace the base repetitively left and right or to rotate the base back and forth about the x-axis so that the probe tip moves back and forth. The probe tip preferably moves with an approximately the same amplitude in each cycle. If a change in vibration amplitude is used to determine touchdown, then the vibration amplitude of the tip is preferably sufficiently large that the change in the tip position during a vibration cycle can be robustly detected by a sensor so that the amplitude can be readily determined. For example, if images of the tip are analyzed to determine the extremes of the vibration cycle to determine the amplitude of the vibration, then the vibration amplitude should be sufficiently large so that the changes in position of the tip at the extremes can to be readily discerned from the images.

If the vibration is too large, the probe may be off of the target when it lands. The vibration is therefore preferably sufficiently small so that the probe would not miss its target. Moreover, if the plane of vibration varies from the plane of the surface and the vibration is large, then the probe can strike the work piece and damage the work piece or the probe. The vibration amplitude is preferably on the order of magnitude of the dimension of the target pad, typically about a few tens of microns.

The vibration is preferably in a plane that is parallel or substantially parallel to the work piece surface. As used herein, "vibrating in a plane" or "moving a probe in a plane" does not exclude that the plane itself is moving. For example, the terms cover a probe that is vibrated in the x-y plane while the probe is also moving toward the work piece surface in the Z plane, so that the z-motion is superimposed onto the motion in the x-y plane.

The angle of intersection between the plane of vibration and the plane of the surface is preferably sufficiently small such that a series of top-down images can observe the change in position of the probe tip during vibration with sufficient accuracy to determine the amplitude of vibration. In some embodiments, the angle is sufficiently small to avoid damage the probe tip or surface as the probe tip contacts the surface because the tip motion includes primarily side-to-side motion. In most embodiments, the angle is less than 30 degrees, more preferably less than 5 degrees, and most preferably less than 1 degree.

In step 106, the probe is driven towards the work piece surface as it is vibrating. While the probe is moved towards the surface, a vibration characteristic, typically the vibration amplitude, is monitored in step 108. Before landing, the probe tip is free to move with the motion of the base. Upon landing, the friction between the probe tip and work piece surface impedes the ability of the probe tip to move freely with the motion of the base.

Monitoring of the probe vibration can be performed in a variety of ways. In some embodiments, the probe vibration is characterized by rapidly forming images of the probe or of a part of the probe. The position of the probe in a series of images is determined. The imaging may be performed by scanning electron microscopy, other types of charged particle beam imaging, or light-based imaging. Scanning electron microscopy (SEM) provides fast image collection at high magnification and large depth of focus, which allows computer vision analysis of collected images to determine the vibration amplitude of the tip.

In some embodiments, the probe performs periodic oscillations in a plane substantially parallel to the work piece surface and about an equilibrium point, with each periodic oscillation corresponding to a different vibration cycle of the probe. Images may be acquired in coordination with the periodic oscillations of the probe. For example, the timing of the image acquisition may be synchronized with the position of the driven base, so that acquisition of the image is triggered when the tip is at or near the extreme position of its vibration. This ensures that the images show the maximum amplitude of the probe tip vibration. Alternatively, multiple images can be acquired per cycle, and the maximum displacement of the tip shown in the multiples images of a cycle is used to estimate of the amplitude of tip vibration. The imaging frequency should be such that images are collected across the whole tip displacement range of the vibration. Images should be taken frequently enough so that there is a statistical likelihood of determining the vibration amplitude with sufficient accurately to determine when a change in the vibration occurs. In one embodiment, an SEM acquires an image at a rate of about 12 Hz. The vibration rate is set at about 2 Hz. This allows about 6 images to be captured per vibration cycle. If images were captured at a frame rate of, for example, 30 Hz, then a preferred vibration rate is below 10 Hz. Because the image is only to be used to determine the vibration amplitude, a complete two-dimensional image of the tip is not required. An image of a thin strip or a single line, such as line 218 (FIG. 2) that cuts across the path of the probe, that is, a line is approximately normal to the probe in its rest position, could increase image acquisition speed, allowing for faster vibration and lower latency. The change in the monitored vibration is detected in step 110. The detected change in vibration may be, for example, a change in the amplitude or phase of the vibration, the strain in the cantilever, the current or power requirements of the actuator or any other property.

The cantilever typically is preferably somewhat flexible and bends as the friction impedes the motion of the tip while the base continues moving, thereby reducing the amplitude of the tip vibration. In some implementations with strong friction, the friction could stop the vibration of the tip altogether. The friction between the probe and the surface and the flexibility of the cantilever will determine the movement of the tip while moving the base after contact.

If the cantilever is rigid, the friction between the tip and the work piece may reduce the motion of the base to reduce the vibration amplitude of the tip, or the friction could require an increased force by the actuators (observable in some embodiments as an increase in current) to maintain a constant vibration amplitude.

When a change in the vibration that meets a predefined criterion is detected in step 110, landing detection is signaled in step 112. The predefined criterion may be determined empirically. In some embodiments, a suitable predetermined criteria may be, for example, a change in the peak-to-peak amplitude of a specified percent, such as 20%, 30%, or 50% between cycles. The expected change in vibration can also be calculated from the coefficient of friction between the tip and the work piece, and the pressure of the cantilever on the work piece surface. If the friction is very low, the change in vibration amplitude may be small.

After landing is signaled in step 112, downward motion of the probe is ceased in step 114. Electrical probing of a circuit on the work piece is begun in step 116.

It is desirable to minimize the latency, that is, the time between touchdown and stopping the downward motion of the probe. It typically takes a few cycles to determine that the amplitude or other characteristic of the vibration has changed, and the probe will continue to increase its force on the work piece during that time. Latency limits the velocity that can be used to lower the probe tip. If touchdown is detected rapidly, allowing the downward motion to be stopped quickly upon contact, then downward motion can be rapid while still preventing excess motion of the probe tip after touchdown. Continuing to move the probe downward after touchdown results in increasing force on the probe tip. If the limit of force to prevent damage to the work piece or probe is known, the downward motion is preferably stopped before that force limit is achieved and the maximum allowable latency can be calculated. For example, if it is desirable that the probe cannot overshoot the surface by more than 50 nm and if latency is 1 sec, then downward velocity is limited to 50 nm/s to avoid damage.

Latency can be reduced by increasing the vibration rate, so that a change in the vibration amplitude is determined more rapidly. As the vibration rate increases, the detection system must still be able to determine the amplitude. For example, if the amplitude is determined from SEM images, the imaging frequency must be sufficient to determine the amplitude during each vibration.

Figure 1B:
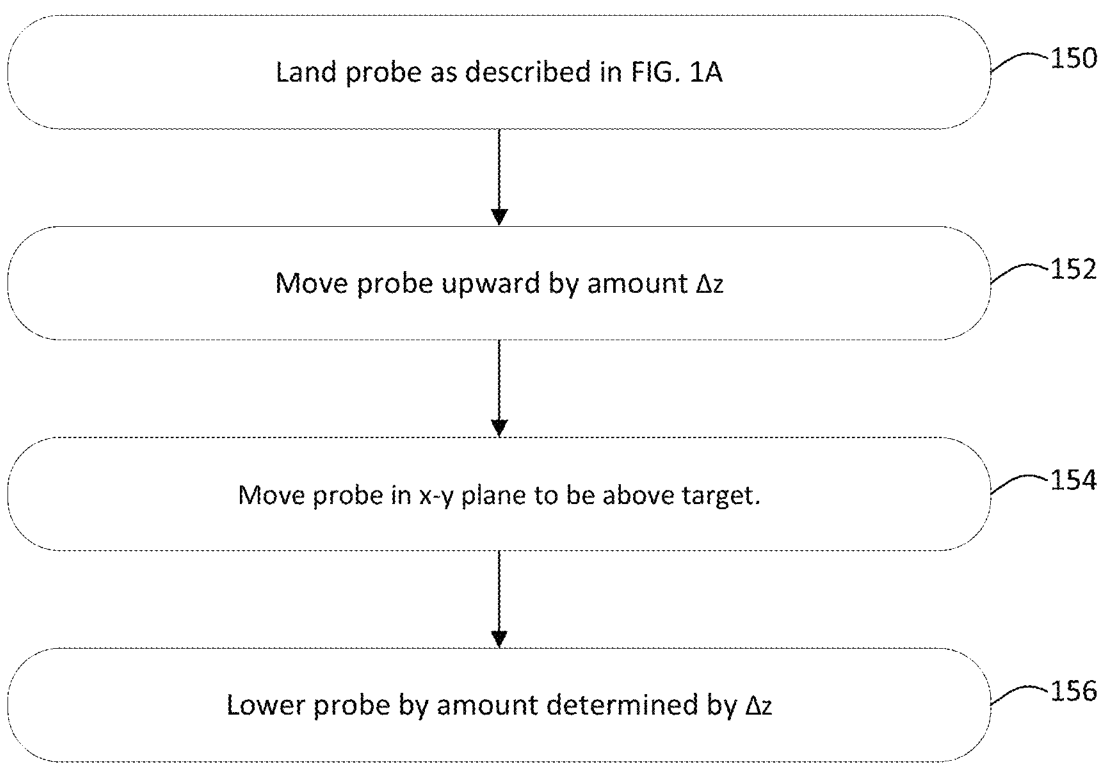
FIG. 1B shows a flowchart of a two-phase landing method.

In some embodiments, then the probe is landed in two phases as shown in FIG. 1B. The two-phase landing is particularly useful if the vibration amplitude is larger than the target size and the probe might miss target because of a lateral offset due to the vibration. In step 150, the probe is landed as shown in FIG. 1A and described above to determine the position of the work piece surface. In step 152, the probe is moved upward by a pre-determined amount, Δz, to just clear the work piece. In step 154, the probe is then moved in the x-y plane to be above the desired target. In step 156, the probe is then re-landed by lowering it by a pre-determined distance. The distance that the probe is lowered in step 156 can be Δz, or the distance can be adjusted, for example, to compensate for excess downward motion caused by latency in the original landing or to otherwise adjust the force on the probe. This two-phase technique can be used regardless of the vibration amplitude to ensure that the probe is lowered accurately onto the target pad without excess pressure.

Figure 2:
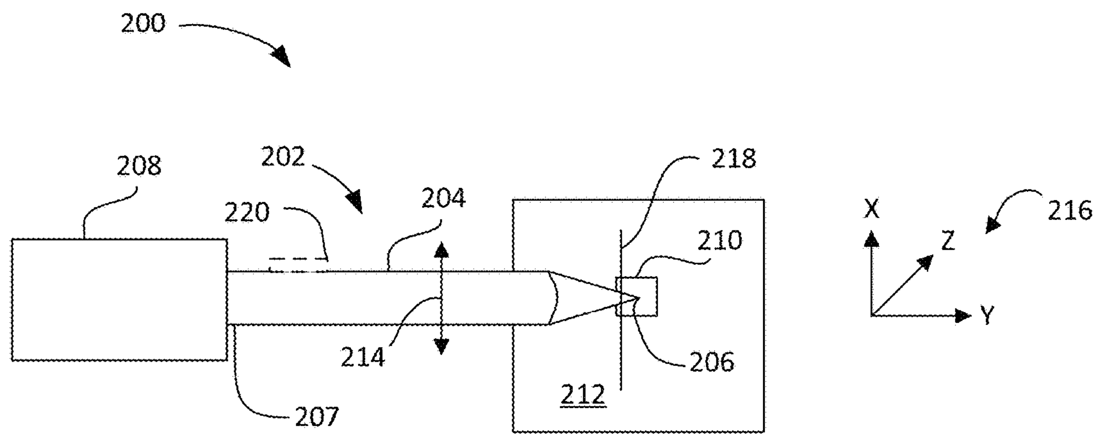
FIG. 2 shows a top-down view of a nano-probe positioned above a work piece.
Figure 3:
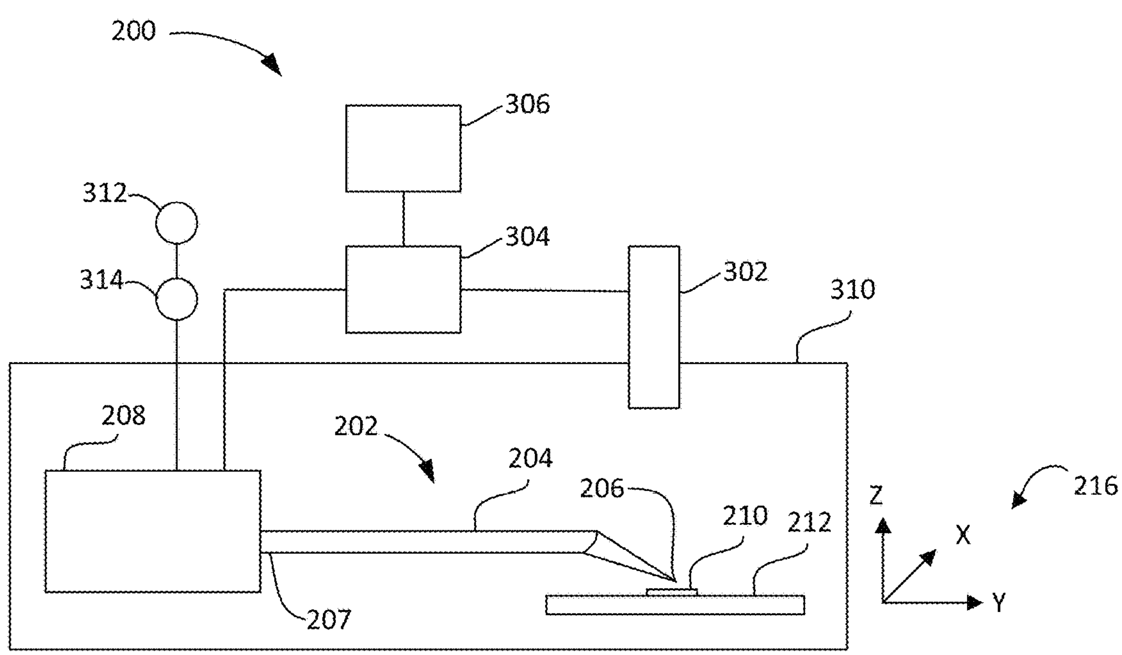
FIG. 3 shows a side view of the nano-probe of FIG. 2.

FIG. 2 shows a top down view of a probe system 200. The probe 202 includes a cantilever 204 and a probe tip 206, the cantilever 204 being connected at its base 207 to actuator 208. The probe tip 206 is located above the target area 210 on work piece surface 212. FIG. 3 shows a side view of the probe system 200 and target area 210. In FIG. 3 the target area 210 is shown raised from the work piece surface 212 for clarity. The target area 210 may in fact be level with the work piece surface. The axes 216 shown in FIG. 2 and FIG. 3 represent the same three-dimensional space. Probe 202 vibrates in the x-y plane as shown by arrow 214, primarily back and forth along the X-axis. An optional strain gauge 220 can be used in some embodiments to detect strain in the cantilever 204.

FIG. 3 also shows an imaging system 302, such as an electron microscope or an optical microscope, a controller 304 that controls the actuator 208. A non-volatile computer memory 306 connected to the controller 304 stores computer instructions for carrying out the steps of the invention. An actuator power source 312 provides power to actuator 208 and optional meter 314 measures the electrical requirements, such as current or power, required at any time by actuator 208. Imaging system 302, controller 304 and computer memory 306 are not shown in FIG. 2 for clarity. When the method uses electron beam imaging, the work piece 212 is maintained in a vacuum chamber 310, which also typically also contains probe 202 and actuators 208. In some embodiments, a system includes multiple probes attached to multiple actuators, the multiple probes contacting different parts of the circuit. The probe tip 206 is preferably physically lower than the probe base 207, that is, the tip is closer to plane of the work piece surface that is the base. In one embodiment, the probe cantilever has a bend in the middle, so that it's proximal half is parallel to the sample and the distal half is 45 degrees to the sample.

Figures 4A, 4B, 4C, 4D:
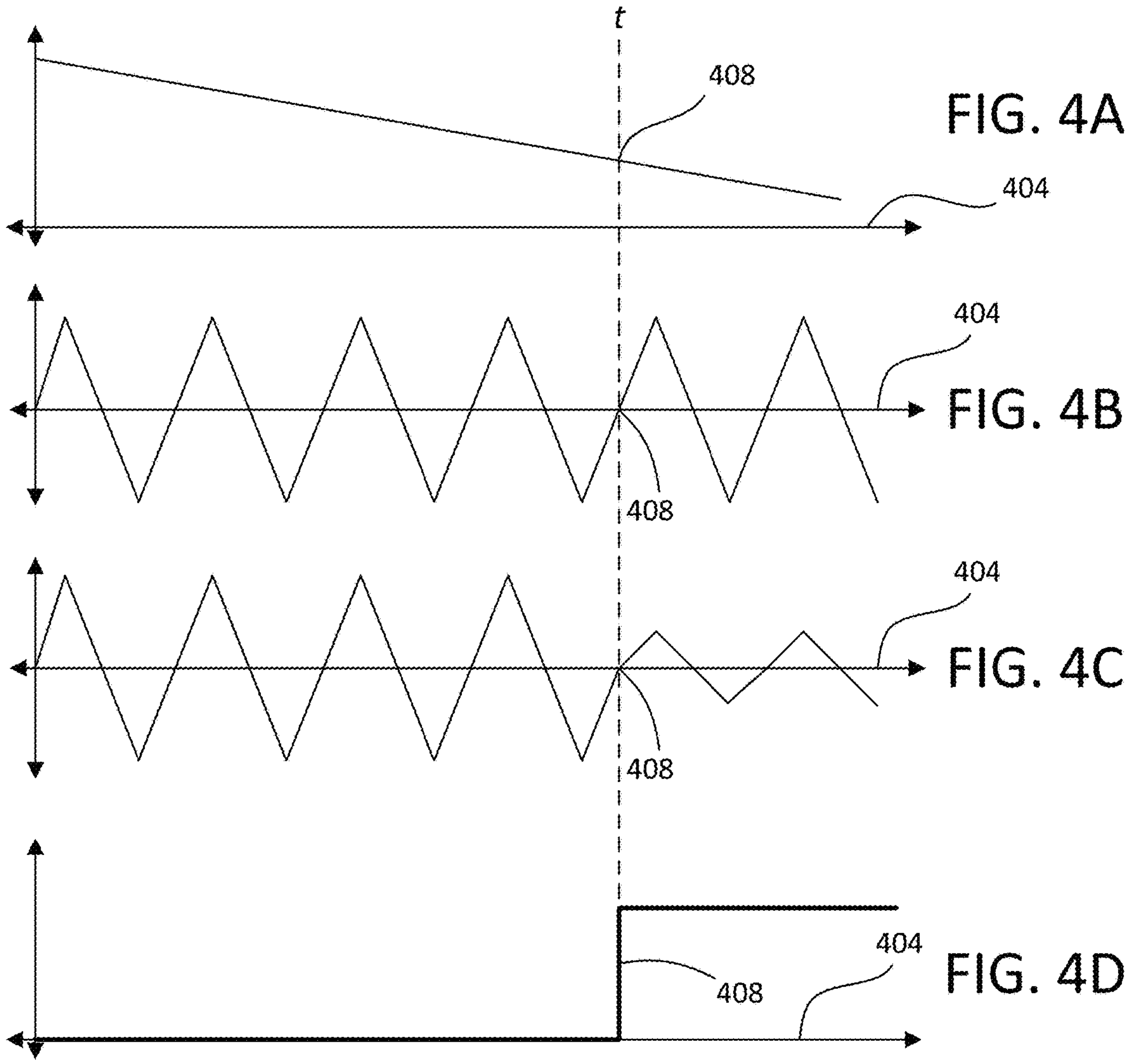
FIG. 4A is a graph showing how the z-height of the work piece probe tip varies with time.
FIG. 4B is a graph showing how the position of the probe base varies with time.
FIG. 4C is a graph showing how the position of the probe tip varies with time.
FIG. 4D is a graph showing how a landing metric varies with time.

FIGS. 4A-4D are schematic graphs illustrating aspects of the process of FIG. 1 performed using the nano-probe of FIGS. 2 and 3. FIG. 4A shows the z-position of the probe tip plotted against time. The probe is driven downwards, making contact with the surface at time t, indicated by line 408. FIG. 4B shows the position in the X-Y plane of the base of the probe over time, where the probe connects to the actuator. The base of the probe is moved back and forth in the x-y plane by the actuator. The amplitude of vibration of the base of the probe before and after time t is the same. FIG. 4C shows the position of the probe tip in the X-Y plane over time, using the same time scale as FIGS. 4A and 4B, although the vertical scales of FIGS. 4A, 4B, and 4C are not the same. For example, if the actuator vibrates the probe by sweeping the probe base back and forth through a range of angles in the X-Y plane, rather than translating the probe back and forth in the X-Y plane, motion near the base will be smaller than motion near the tip.

While the probe is being lowered toward the surface, the ratio of the vibration amplitude at the probe base and tip is constant, but when the probe tip makes contact with the surface at time t, the vibration at the probe tip is dampened by friction with the surface and the amplitude of the vibration decreases. While FIGS. 4B and 4C do not show a phase change after contact, in some cases the friction of the tip on the work piece will cause the motion of the tip to lag the motion of the base, making the two motions out of phase to some degree. FIG. 4D shows an ideal probe landing signal. When the amplitude of the vibration is decreased as shown in FIG. 4C, the change is recognized and a probe landing signal of FIG. 4D is toggled to indicate that the probe has landed. There will typically be a small delay between the time that the change in vibration occurs to the time that the change in vibration is detected, which delay is not shown in FIG. 4D.

Figure 5:
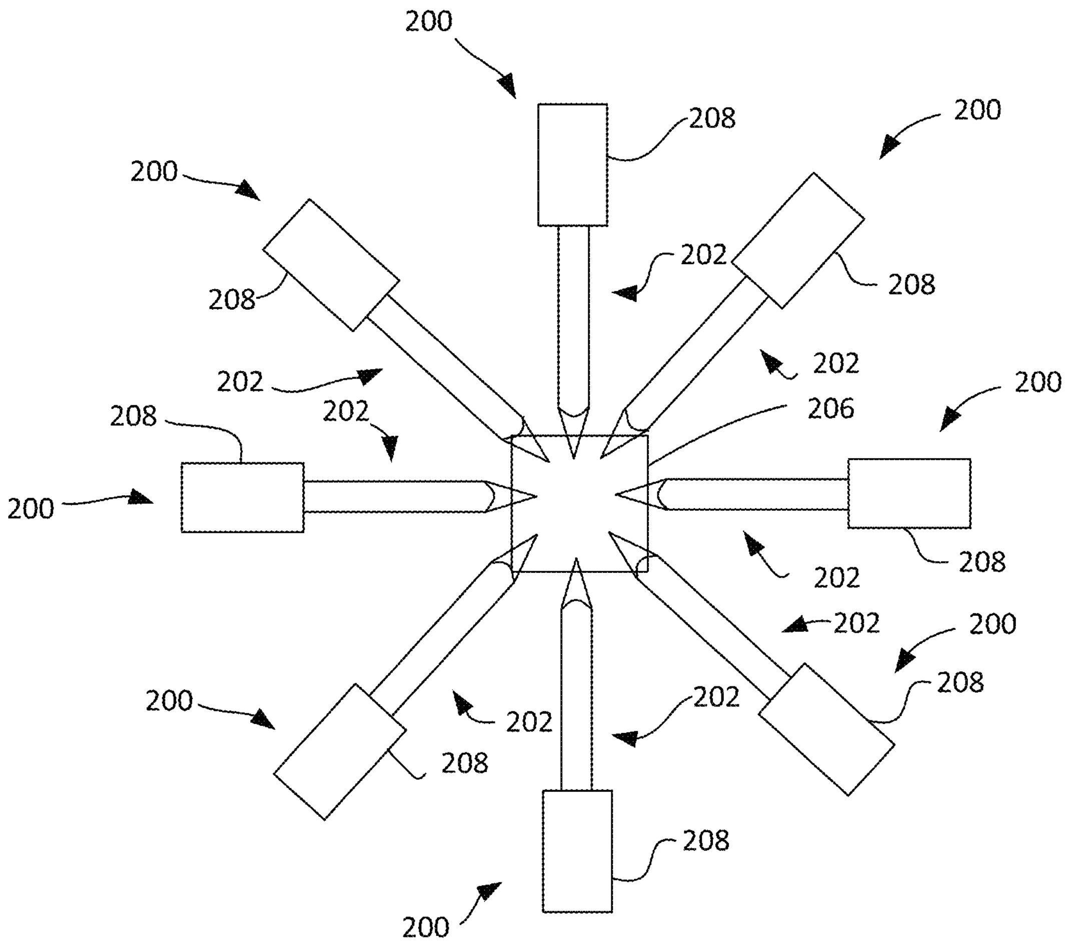
FIG. 5 is a schematic of a nano-probe system, having multiple probes.

FIG. 5 shows a nano-probing system having multiple probes 200. The sample located in the center of the device may be contacted by a multitude of probes surrounding the sample. FIG. 5 shows a radial probe distribution, but other probe arrangements are possible. In addition, a single or multiple probes may be used at any one time.

Figure 6:
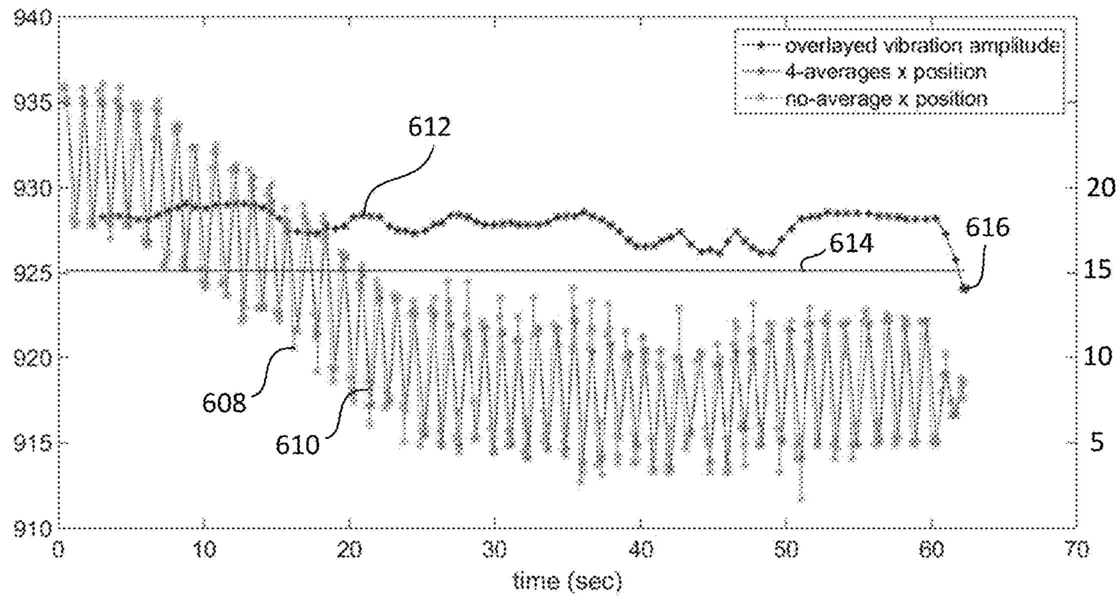
FIG. 6 is a graph of probe tip position along the X-axis with time.

FIG. 6 shows the experimental results of a process performed in accordance with the method of FIG. 1. The scale on the left axis represents the x-position of the probe tip and the scale on the right represents the amplitude of the vibration. The vibration amplitude before touchdown is about 20 nm. The field of view of the SEM used to measure the probe position and determine the vibration was 2.3 microns. Line 608 shows the position of the tip. Line 610 shows a moving average of the tip position at the extreme displacement of the four most recent vibration cycles. Detection is based on vision interpretation, so a moving average provides a filter that more accurately detects a change in amplitude, but at the expense of an increase in latency. Line 612 shows the calculated vibration amplitude. Line 614 shows the predetermined threshold 612 used to determine when the change in vibration amplitude indicates probe landing. As the tip makes contact with the sample surface, the vibration amplitude decreases below the threshold 614, and landing detection is signaled at point 616. The latency is shown as the difference in time between the first indication of a change in application and time of point 616.

As the purpose of the vibrating the probe is to detect a change in vibration upon touchdown, a preferred vibration amplitude can be determined relative to the resolution of the imaging system. For example, the vibration amplitude can be determined as a number of pixels of the imaging system, rather than in length units. For example, a peak-to-peak vibration amplitude of 20 pixels, can provide a sufficiently large motion so that a change in the motion will appear as a few pixels and is readily detectable. For example, in an SEM with a field of view of 2 microns and an image comprising 1,000×1,000 pixels, each pixel represents about 2 nanometers. If it is desired to have the amplitude represent 10 pixels peak-to-peak, then the probe would be set to a vibration amplitude of about 20 nm.

Figure 7:
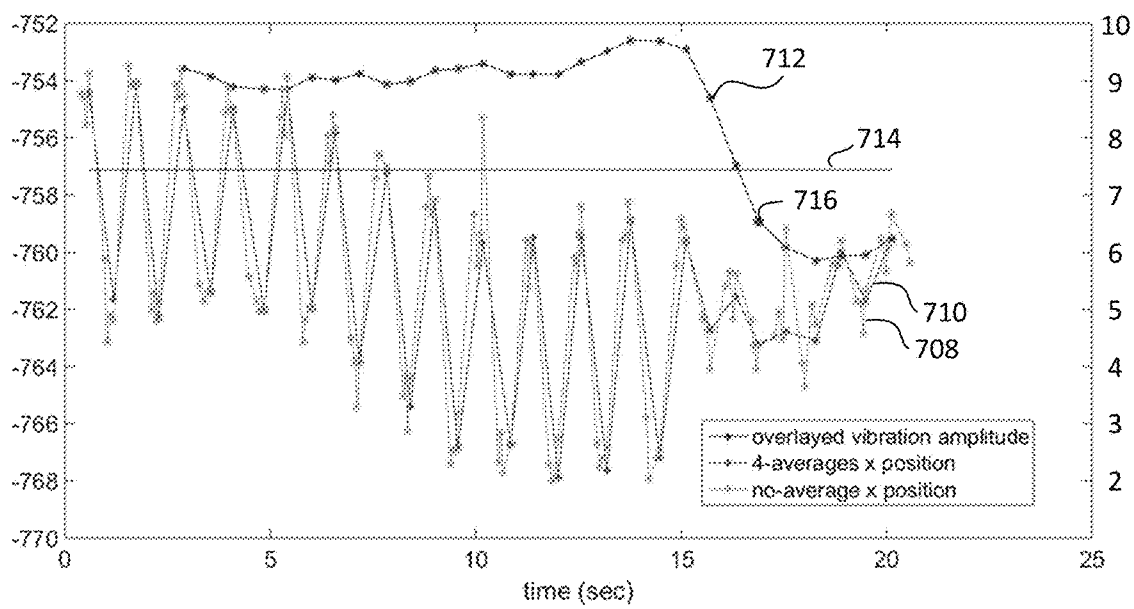
FIG. 7 is a graph of probe tip position along the X-axis with time.

FIG. 7 shows a similar graph for a subsequent experiment, also with a vibration amplitude of 10 nm, and an SEM field of view of 2.3 microns. Line 708 shows the position of the tip. Line 710 shows a four cycle moving average of the probe tip position. Line 712 shows the calculated vibration amplitude. Line 714 shows the predetermined threshold 712 used to determine when the change in vibration amplitude indicates probe landing. As the tip makes contact with the sample surface, the vibration amplitude decreases below 714 the threshold, and landing detection is signaled at point 716.

Thus, determining the preferred amplitude and frequency of the probe tip vibration for any particular implementation includes several competing factors. A large vibration facilitates detecting a change in amplitude using image processing, but can result in the probe being too far from landing pad at touchdown. Moreover, with a large vibration amplitude, any deviation of the plane of vibration from parallel with the work piece surface is more likely to damage the probe tip or work piece as the tip strikes the work piece. The highest possible vibration frequency is desirable to reduce latency, but the vibration frequency is limited by the imaging speed.

Using image analysis allows landing detection without the addition of more components to the probing system, instead using the available imaging capability. Because using image processing to determine the vibration amplitude can be readily automated, some embodiments do not require an operator. Moreover, because the method does not rely on operator observation, the controller can land multiple probes simultaneously. Because the controller can detect the change in vibration rapidly, the controller can lower the probes more rapidly and still stop them before the probe or work piece is damage. By reducing the stress imparted to the probe during each landing, the useful life of the probe is extended. Replacing probes is a time-consuming procedure, so extending the probe life reduces process down time. Improved consistency in the probe landing can increase the consistency in the electrical contact between the probe and the work piece, thereby improving electrical test fidelity.

Other means of monitoring the vibration characteristics can be used, and the invention is not limited to any particular means of determining a change in vibration. For example, a strain gauge on the cantilever can detect bending due to the friction of contact. Also, the force required to drive the base will increase when the probe tip contacts the work piece, so a change in drive current of the base can also be used to determine when the probe tip has contacted the base. A light source together with a mirror on the cantilever near the tip can be used together with a light detector to determine a change in vibration.

Some embodiments provide a method for detection of contact of a probe with a work piece surface, comprising:

moving the probe towards the work piece surface;

vibrating the probe substantially parallel to the work piece surface, monitoring one or more vibration characteristics of the probe; and detecting a change, caused by contacting the work piece surface with the probe, in at least one of the vibration characteristics.

In some embodiments, monitoring the one or more vibration characteristics of the probe includes acquiring multiple images of at least a portion of the probe.

In some embodiments, the probe includes a probe tip and wherein acquiring multiple images of at least of the portion of the probe comprises acquiring multiple images of at least a portion of the probe tip.

In some embodiments, acquiring multiple images of at least of the portion of the probe comprises acquiring multiple images with a scanning electron microscope.

In some embodiments, detecting a change in at least one of the vibration characteristic comprises detecting the change by computer analysis of the multiple images.

In some embodiments, detecting a change in at least one of the vibration characteristic comprises detecting a change in the amplitude of the vibration.

In some embodiments, vibrating the probe comprises inducing periodic oscillations of the probe in a plane substantially parallel to the work piece surface and about an equilibrium point, each periodic oscillation corresponding to a different vibration cycle of the probe; and acquiring multiple images of at least a portion of the probe comprises coordinating the acquisition of the images with the periodic oscillations of the probe.

In some embodiments, vibrating the probe comprises driving a probe base to provide a periodic oscillation; and acquiring multiple images of at least a portion of the probe comprises coordinating the acquisition of the images with the phase of the periodic oscillation of the probe base.

In some embodiments, acquiring multiple images of the portion of the probe includes acquiring at least 2 images per vibration cycle of the probe.

Some embodiments further comprise terminating motion of the probe towards the workpiece surface when contact between the probe and the workpiece surface is detected.

In some embodiments, the method is performed automatically.

In some embodiments, the probe is a first probe and wherein one or more additional probes are moved and monitored simultaneously, at the same time as the first probe.

In some embodiments, detecting a change in at least one of the vibration characteristics of the probe comprises detecting a change in phase of the vibration of the probe.

In some embodiments, detecting a change in at least one of the vibration characteristics comprises detecting mechanical strain in the probe.

In some embodiments, vibrating the probe comprises moving an actuator connected to the probe; and monitoring one or more vibration characteristics comprises monitoring an electrical current through the actuator, a power consumption of the actuator, or other electrical requirement of the actuator, during vibration of the probe by the actuator.

Some embodiments provide a method of detecting contact between a probe and a work piece surface, comprising:

moving the probe in a direction having a first component normal to the work piece surface and having a second component parallel to the work piece surface;

monitoring the motion of the probe in the direction of the second component;

detecting a change in the motion of the probe in the direction of the second component, caused by the probe contacting the work piece surface; and terminating the motion of the probe in a direction of the first component.

In some embodiments, moving the probe in a direction having a first component normal to the work piece surface and having a second component parallel to the work piece surface comprises moving the probe toward the work piece surface while vibrating the probe parallel to the work piece surface.

Some embodiments provide an apparatus for testing a circuit, comprising:

a circuit probe assembly including a probe and at least one actuator configured to position the probe;

a monitoring device configured to monitor the probe;

a controller configured to control the monitoring device and to control the actuator to move the probe; and a computer memory storing computer instructions for controlling the monitoring device and the actuator for:

moving the probe towards the work piece surface;

vibrating the probe substantially parallel to the work piece surface;

monitoring the vibration; and detecting a change in the vibration caused by the probe contacting the work piece surface.

In some embodiments, the monitoring device comprises an electron microscope.

In some embodiments, the monitoring device comprises a strain gauge for monitoring the probe or an electrical meter for monitoring changes in the actuator electrical requirements.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. The invention has broad applicability and can provide many benefits as described and shown in the examples above. The embodiments will vary greatly depending upon the specific application, and not every embodiment will provide all of the benefits and meet all of the objectives that are achievable by the invention.

It should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a non-transitory storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of non-transitory computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

In the following discussion and in the claims, the terms "including" and "comprising" are used in an open-ended fashion, and thus should be interpreted to mean "including, but not limited to . . . " To the extent that any term is not specially defined in this specification, the intent is that the term is to be given its plain and ordinary meaning. The accompanying drawings are intended to aid in understanding the present invention and, unless otherwise indicated, are not drawn to scale.

The various features described herein may be used in any functional combination or sub-combination, and not merely those combinations described in the embodiments herein. As such, this disclosure should be interpreted as providing written description of any such combination or sub-combination.

Although the present invention and its advantages have been described in detail, it should be understood that various changes, substitutions and alterations can be made to the embodiments described herein without departing from the scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A method for detection of contact of a probe with a work piece surface, comprising:

moving the probe towards the work piece surface;

vibrating the probe to induce periodic oscillations of the probe in a plane substantially parallel to the work piece surface;

monitoring one or more vibration characteristics of the probe based on multiple images of at least a portion of the probe acquired by coordinating the acquisition of the multiple images with the periodic oscillations of the probe; and detecting a change, caused by contacting the work piece surface with the probe, in at least one of the vibration characteristics.

2. The method of claim 1, wherein the probe includes a probe tip and wherein acquiring multiple images of at least of the portion of the probe comprises acquiring multiple images of at least a portion of the probe tip.

3. The method of claim 1, wherein acquiring multiple images of at least of the portion of the probe comprises acquiring multiple images with a scanning electron microscope.

4. The method of claim 1, wherein detecting a change in at least one of the vibration characteristics comprises detecting the change by computer analysis of the multiple images.

5. The method of claim 1, wherein detecting a change in at least one of the vibration characteristics comprises detecting a change in the amplitude of the vibration.

6. The method of claim 1, wherein each periodic oscillation corresponding to a different vibration cycle of the probe.

7. The method of claim 1, wherein:

vibrating the probe comprises driving a probe base to provide the periodic oscillation; and coordinating the acquisition of the multiple images with the periodic oscillations of the probe includes coordinating the acquisition of the multiple images with the phase of the periodic oscillation of the probe base.

8. The method of claim 1, wherein acquiring multiple images of the portion of the probe includes acquiring at least 2 images per vibration cycle of the probe.

9. The method of claim 1, further comprising terminating motion of the probe towards the workpiece surface when contact between the probe and the workpiece surface is detected.

10. The method of claim 1, wherein the method is performed automatically.

11. The method of claim 1, wherein the probe is a first probe and wherein one or more additional probes are moved and monitored simultaneously, at the same time as the first probe.

12. The method of claim 1, wherein detecting a change in at least one of the vibration characteristics of the probe comprises detecting a change in phase of the vibration of the probe.

13. The method of claim 1, wherein detecting a change in at least one of the vibration characteristics comprises detecting mechanical strain in the probe.

14. The method of claim 1, in which:

vibrating the probe comprises moving an actuator connected to the probe; and monitoring one or more vibration characteristics comprises monitoring an electrical current through the actuator, a power consumption of the actuator, or other electrical requirement of the actuator, during vibration of the probe by the actuator.

15. A method of detecting contact between a probe and a work piece surface, comprising:

moving the probe in a direction having a first component normal to the work piece surface and having a second component parallel to the work piece surface, wherein the probe is oscillated periodically parallel to the work piece surface;

monitoring the motion of the probe in the direction of the second component based on multiple images of at least a portion of the probe acquired by coordinating the acquisition of the multiple images with the periodic oscillations of the probe;

detecting a change in the motion of the probe in the direction of the second component, caused by the probe contacting the work piece surface; and terminating the motion of the probe in a direction of the first component.

16. The method of claim 15 in which moving the probe in the direction having the first component normal to the work piece surface and having the second component parallel to the work piece surface comprises moving the probe toward the work piece surface while vibrating the probe parallel to the work piece surface.

17. An apparatus for testing a circuit, comprising:

a circuit probe assembly including a probe and at least one actuator configured to position the probe;

a monitoring device configured to monitor the probe;

a controller configured to control the monitoring device and to control the actuator to move the probe; and a computer memory storing computer instructions for controlling the monitoring device and the actuator for:

moving the probe towards a work piece surface;

vibrating the probe to induce periodic oscillations of the probe in a plane substantially parallel to the work piece surface;

monitoring the vibration based on multiple images of at least a portion of the probe acquired by coordinating the acquisition of the multiple images with the periodic oscillations of the probe; and detecting a change in the vibration caused by the probe contacting the work piece surface.

18. The apparatus of claim 17 in which the monitoring device comprises an electron microscope.

19. The apparatus of claim 17 in which the monitoring device comprises a strain gauge for monitoring the probe or an electrical meter for monitoring changes in actuator electrical requirements.

* * * * *